United States Patent
Do

(10) Patent No.: US 7,254,065 B2
(45) Date of Patent: Aug. 7, 2007

(54) SEMICONDUCTOR MEMORY DEVICE WITH INTERNAL VOLTAGE GENERATOR

(75) Inventor: Chang-Ho Do, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 56 days.

(21) Appl. No.: 11/139,181

(22) Filed: May 27, 2005

(65) Prior Publication Data

US 2006/0140038 A1   Jun. 29, 2006

(30) Foreign Application Priority Data

Dec. 28, 2004  (KR) .................. 10-2004-0113611

(51) Int. Cl.
  *G11C 5/14* (2006.01)
(52) U.S. Cl. .................. 365/189.09; 365/189.07; 365/191; 365/226
(58) Field of Classification Search .......... 365/189.09, 365/191, 226, 189.07; 327/105, 534
See application file for complete search history.

(56) References Cited

U.S. PATENT DOCUMENTS

| | | | | |
|---|---|---|---|---|
| 6,765,428 B2* | 7/2004 | Kim et al. | .................. | 327/534 |
| 2003/0071679 A1* | 4/2003 | Kono et al. | .................. | 327/538 |
| 2004/0150463 A1* | 8/2004 | Senda | .................. | 327/534 |

* cited by examiner

*Primary Examiner*—Richard T. Elms
*Assistant Examiner*—Pho M. Luu
(74) *Attorney, Agent, or Firm*—Blakely Sokoloff Taylor & Zafman

(57) ABSTRACT

An internal voltage generator for use in a semiconductor memory device, includes: an internal voltage generation unit for generating an internal voltage by performing a charge pumping operation to a power supply voltage based on a result of comparing the internal voltage with a reference voltage; and an initial internal voltage generation unit for supplying the power supply voltage as the internal voltage based on a result of comparing the internal voltage with the power supply voltage when an operating voltage supplied to the semiconductor memory device is lower than a predetermined voltage level.

12 Claims, 4 Drawing Sheets

SEMICONDUCTOR MEMORY DEVICE WITH INTERNAL VOLTAGE GENERATOR

FIELD OF INVENTION

The present invention relates to an internal voltage generator for use in a semiconductor memory device; and, more particularly, to an internal voltage generator capable of stably generating an internal voltage.

DESCRIPTION OF PRIOR ART

An internal voltage generator for use in a semiconductor memory device generates internal voltages having various voltage levels to be used in the semiconductor memory device by using a power supply voltage VDD. Since the internal voltage generator is included in the semiconductor memory device, it is important that the internal voltage generator stably generates an internal voltage regardless of variations of temperature, pressure or manufacturing process.

If a voltage level of the internal voltage is unstable, a circuit supplied with the internal voltage may be physically damaged. For instance, a metal oxide semiconductor (MOS) transistor including a p-type semiconductive material and an n-type semiconductive material may be physically damaged due to an unexpected current flow at a PN junction caused by an unstable internal voltage supplied to the MOS transistor.

Therefore, it is desirable to appropriately control the voltage level of the internal voltage in order to keep the voltage level as a stable level.

FIG. 1A is a cross sectional view of an inverter including a complementary metal oxide semiconductor (CMOS) transistor.

As shown, a source of a p-type metal oxide semiconductor (PMOS) transistor PM1 receives an external power supply voltage VDD and a substrate of the PMOS transistor PM1 is supplied with a high voltage VPP. A source of an n-type metal oxide semiconductor (NMOS) transistor NM1 receives a power supply voltage VSS and a substrate of the NMOS transistor NM1 is supplied with a low voltage VBB. Herein, the high voltage VPP is higher than the external power supply voltage VDD and the low voltage VBB is lower than the power supply voltage VSS.

As described above, substrates of the PMOS transistor PM1 and the NMOS transistor NM1 are supplied with voltages different from voltages supplied to sources of the PMOS transistor PM1 and the NMOS transistor NM1 respectively so as to improve a performance of a semiconductor memory device and reduce a size of a die.

However, since a voltage supplied to a substrate is different from a voltage supplied to a source, a parasitic bipolar junction transistor (BJT) is formed in the inverter.

FIG. 1B is a schematic circuit diagram showing parasitic BJTs formed in the inverter. As shown, a base of one of the parasitic BJTs is coupled to a collector of the other of the parasitic BJTs.

FIG. 2 is a block diagram showing a conventional internal voltage generator.

As shown, the conventional internal voltage generator includes a level detector 20, a periodic signal generator 22, a charge pumping unit 24 and an initializing unit 40.

The level detector 20 compares a voltage level of a low voltage VBB with a voltage level of a reference voltage VBB_REF to thereby generate a detection signal BBE. The periodic signal generator 22 generates a periodic signal tOSC according to the detection signal BBE. The charge pumping unit 24 performs a negative charge pumping operation to a power supply voltage VSS to thereby generate the low voltage VBB.

The initializing unit 40 maintains the low voltage as a predetermined voltage level at an initial state in which an external voltage VDD is not stable. The initializing unit 40 includes an NMOS transistor NM2. A drain of the NMOS transistor NM2 is coupled to the power supply voltage VSS and a source of the NMOS transistor NM2 is coupled to the low voltage VBB. A gate and the source of the NMOS transistor NM2 are coupled. Herein, a driving strength of the initializing unit 40 is smaller than that of the charge pumping unit 24.

An operation of the conventional internal voltage generator is described below.

At the initial state, since the external power supply voltage VDD is unstable, the low voltage VBB is generated by the initializing unit 40. The initializing unit 40 prevents the low voltage VBB from being higher than a threshold voltage Vt.

Thereafter, when the external power supply voltage VDD is stabilized, the level detector 20 activates the detection signal BBE if the low voltage VBB becomes higher than the reference voltage VBB_REF. Consequently, the periodic signal generator 22 generates the periodic signal tOSC in response to the detection signal BBE.

Thereafter, in response to the periodic signal tOSC, the charge pumping unit 24 performs the negative charge pumping operation to the power supply voltage VSS to thereby stabilize the low voltage VBB.

FIG. 3 is a graph showing variations of the high voltage VPP and the low voltage VBB as the external power supply voltage VDD is increased.

As shown, the low voltage VBB is continuously increased until the external power supply voltage VDD becomes a predetermined voltage level 'a'. After the external power supply voltage VDD is increased to the predetermined voltage level 'a', the low voltage VBB is decreased to be stabilized until the low voltage VBB becomes a predetermined stable voltage level 'b'.

Meanwhile, according to the conventional voltage generator, even though the initializing unit 40 is employed to prevent the low voltage VBB from being higher than the threshold voltage Vt, the low voltage VBB is increased due to a coupling effect caused by a parasitic capacitance generated by an internal bias and the high voltage VPP.

In addition, since the parasitic capacitance is relatively large in the inverter shown in FIG. 1A, the low voltage VBB is more increased.

Meanwhile, when the low voltage VBB is higher than the power supply voltage VSS, if a voltage difference between the low voltage VBB and the power supply voltage VSS becomes higher than a threshold voltage of a p-type junction and an n-type junction of the parasitic BJT shown in FIG. 1B, the PN junction is turned on.

Accordingly, an excessive current flow is generated between the source of the PMOS transistor PM1 and the substrate of the NMOS transistor NM1 and between the substrate of the PMOS transistor PM1 and the source of the NMOS transistor NM1. This problem is generally called a latch-up phenomenon, and a circuit may be physically damaged by the latch-up phenomenon.

SUMMARY OF INVENTION

It is, therefore, an object of the present invention to provide a semiconductor memory device for stably generating an internal voltage having a lower voltage level than a ground.

In accordance with an aspect of the present invention, there is provided an internal voltage generator for use in a semiconductor memory device, including an internal voltage generation unit for generating an internal voltage by performing a charge pumping operation to a power supply voltage based on a result of comparing the internal voltage with a reference voltage; and an initial internal voltage generation unit for supplying the power supply voltage as the internal voltage based on a result of comparing the internal voltage with the power supply voltage when an operating voltage supplied to the semiconductor memory device is lower than a predetermined voltage level.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an internal voltage generator in accordance with the present invention will be described in detail referring to the accompanying drawings.

Figure 1A:
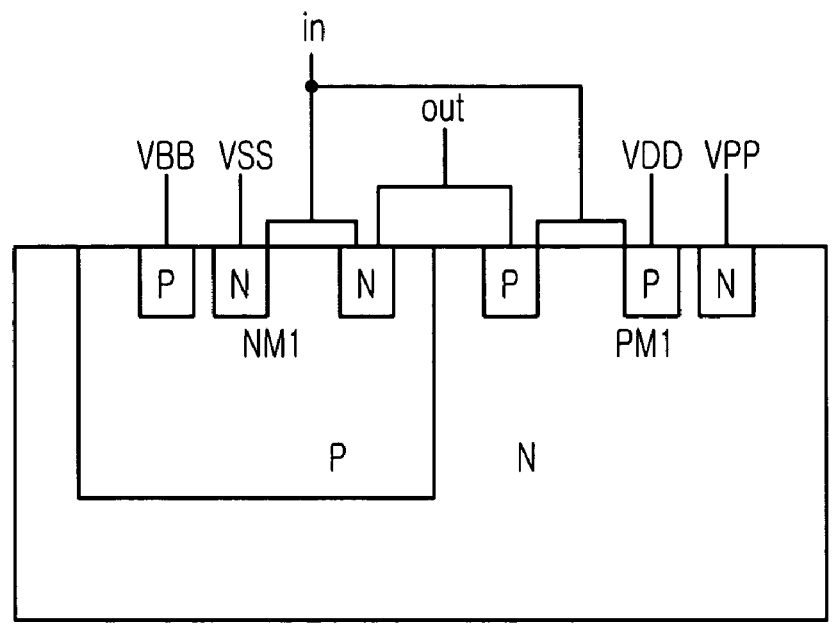
FIG. 1A is a cross sectional view of an inverter including a complementary metal oxide semiconductor (CMOS) transistor.
Figure 1B:
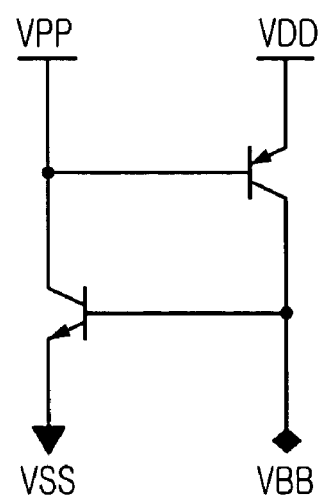
FIG. 1B is a schematic circuit diagram showing a parasitic bipolar junction transistor (BJT) included in the inverter shown in FIG. 1A.
Figure 2:
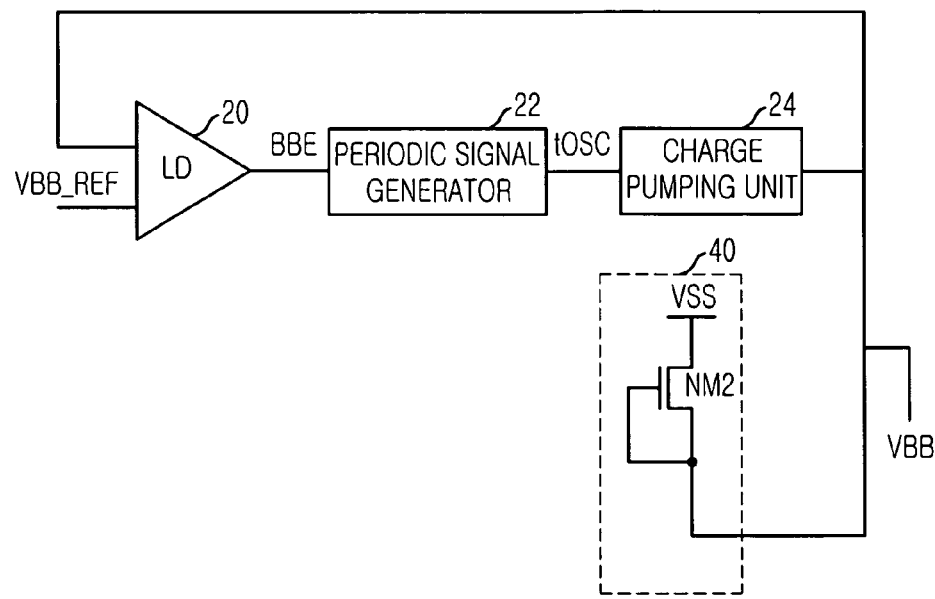
FIG. 2 is a block diagram showing a conventional internal voltage generator.
Figure 3:
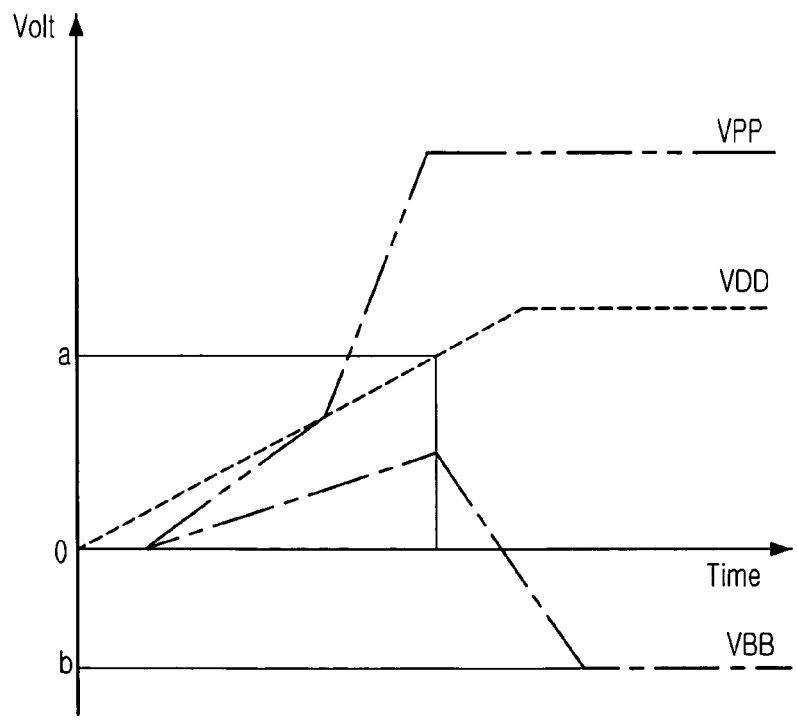
FIG. 3 is a graph showing a variation of an internal voltage generated by the conventional internal voltage generator shown in FIG. 2.
Figure 4:
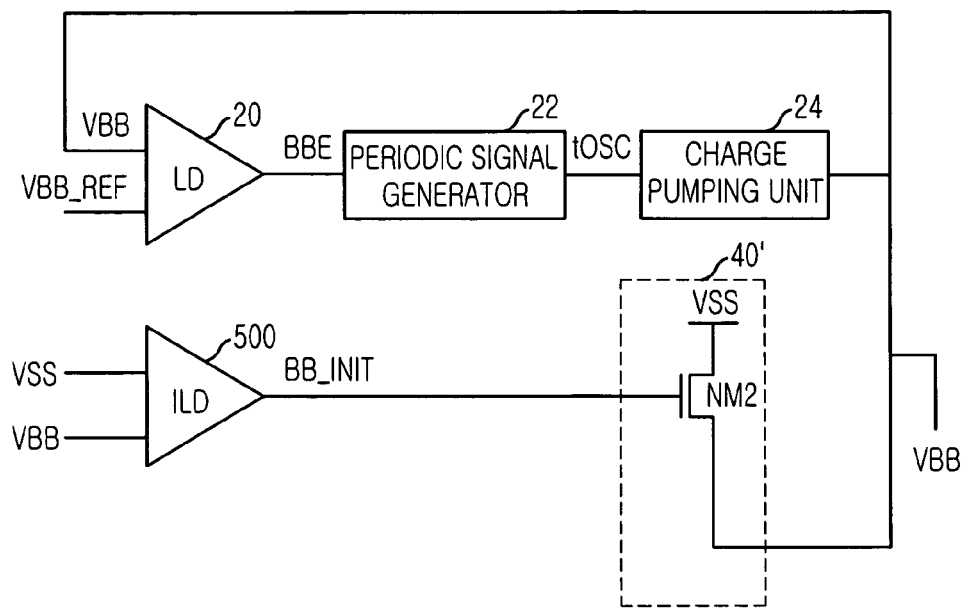
FIG. 4 is a block diagram showing an internal voltage generator for use in a semiconductor memory device in accordance with a preferred embodiment of the present invention.

FIG. 4 is a block diagram showing an internal voltage generator for use in a semiconductor memory device in accordance with a preferred embodiment of the present invention.

As shown, the internal voltage generator includes a level detector 20, a periodic signal generator 22, a charge pumping unit 24, an initial driver 40' and an initial level detector 500.

The level detector 20 compares a voltage level of a low voltage VBB with a voltage level of a reference voltage VBB_REF to thereby generate a detection signal BBE. The periodic signal generator 22 generates a periodic signal tOSC according to the detection signal BBE. The charge pumping unit 24 performs a negative charge pumping operation to a power supply voltage VSS to thereby generate the low voltage VBB.

The initial level detector 500 compares a voltage level of the power supply voltage VSS with the voltage level of the low voltage VBB to thereby generate an initial detection signal BB_INIT. The initial driver 40' drives the low voltage VBB as the power supply voltage VSS in response to the initial detection signal BB_INIT.

Herein, the power supply voltage VSS has a ground voltage level, and thus, the low voltage VBB has a negative voltage level.

Figure 5:
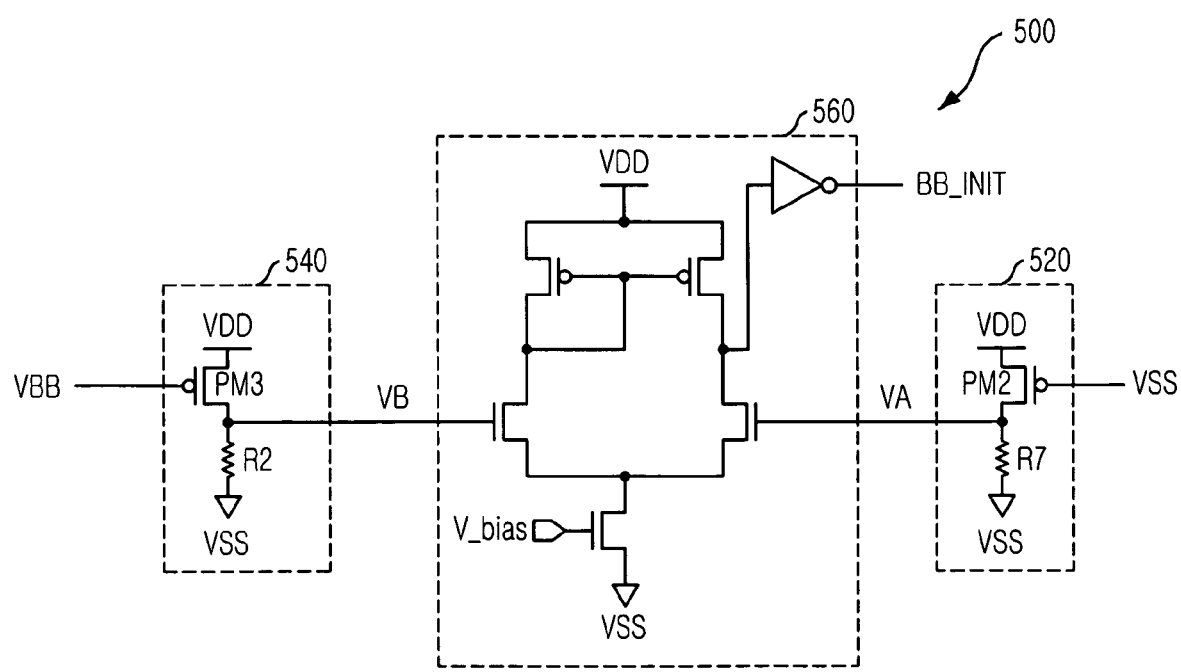
FIG. 5 is a schematic circuit diagram showing an initial level detector shown in FIG. 4.

FIG. 5 is a schematic circuit diagram showing the initial level detector 500 shown in FIG. 4.

As shown, the initial level detector 500 includes a first signal receiving unit 520, a second signal receiving unit 540 and a differential amplifier 560.

The first and the second signal receiving units 520 and 540 receive the power supply voltage VSS and the low voltage VBB to thereby generate a first input signal VA and a second input signal VB respectively.

The differential amplifier 560, which is activated by a bias voltage V_bias, receives the first input signal VA and the second input signal VB as differential inputs to thereby generate the initial detection signal BB_INIT.

The first signal receiving unit 520 includes a first p-type metal oxide semiconductor (PMOS) transistor PM2 and a first resistor R1. A source and a gate of the first PMOS transistor PM2 are supplied with an external power supply voltage VDD and the power supply voltage VSS respectively. The first resistor R1 is connected between the first PMOS transistor PM2 and the power supply voltage VSS. The first input signal VA is outputted from a drain of the first PMOS transistor PM2.

That is, the first input signal VA is generated according to a variation of a valid resistance of the first PMOS transistor PM2, where the variation of the valid resistance of the first PMOS transistor PM2 is caused by a gate-source voltage Vgs loaded between the gate and the source of the first PMOS transistor PM2.

Meanwhile, since a structure of the second signal receiving unit 540 is same to that of the first signal receiving unit 520, detailed descriptions of the second signal receiving unit 520 are omitted herein.

An operation of the initial level detector is described below, referring to FIGS. 4 and 5. Herein, it is assumed that a resistance of a second resistor R2 included in the second signal receiving unit 520 and a resistance of the first resistor R1 are the same; and, also, a size of a second PMOS transistor PM3 included in the second signal receiving unit 540 and a size of the first PMOS transistor PM2 are the same.

When the voltage level of the low voltage VBB is higher than the power supply voltage VSS, a gate-source voltage Vgs of the second PMOS transistor PM3 is larger than the gate-source voltage Vgs of the first PMOS transistor PM2 and, thus, a valid resistance of the second PMOS transistor PM3 is smaller than a valid resistance of the first PMOS transistor PM2.

Therefore, since the second input voltage VB becomes larger than the first input voltage VA, the differential amplifier 560 activates the initial detection signal BB_INIT as a logic high level.

Thereafter, when the voltage level of the low voltage VBB is lower than the voltage level of the power supply voltage VSS, the differential amplifier 560 inactivates the initial detection signal BB_INIT as a logic low level.

Figure 6:
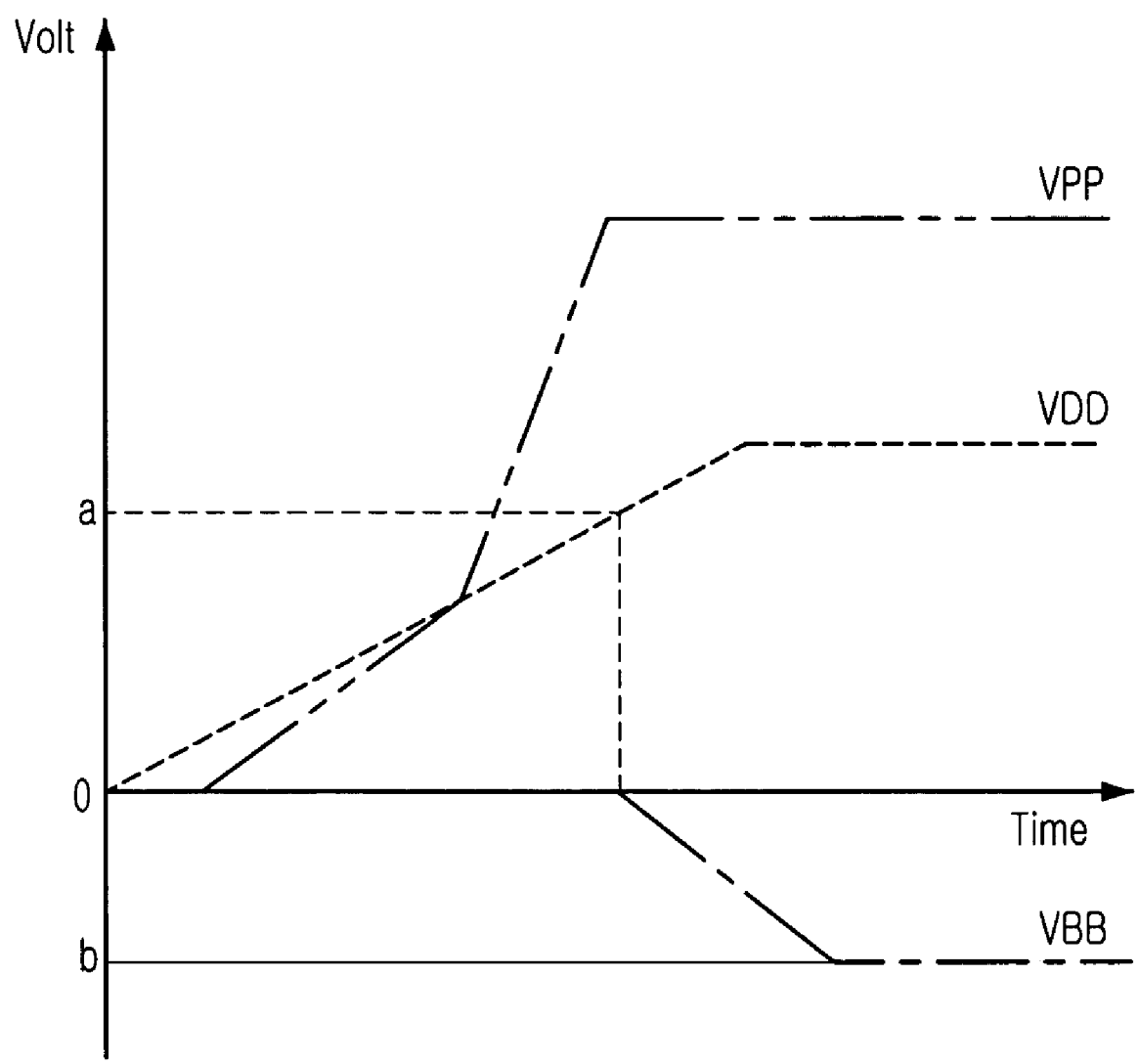
FIG. 6 is a graph showing a variation of an internal voltage generated by the internal voltage generator shown in FIG. 4.

FIG. 6 is a graph showing a variation of the low voltage VBB.

At an initial state, where the external power supply voltage VDD is not stable, the voltage level of the low voltage VBB is increased as described above. However, when the voltage level of the low voltage VBB becomes higher than the power supply voltage VSS, the initial level detector 560 activates the initial detection signal BB_INIT.

Therefore, the initial driver 40' supplies the power supply voltage VSS as the low voltage VBB in response to the initial detection signal BB_INIT and, thus, the voltage level of the low voltage VBB cannot be higher than the power supply voltage VSS.

Meanwhile, when a voltage level of the external power supply voltage VDD comes becomes a predetermined voltage level 'a', the level detector 20 generates the detection signal BBE based on a result of comparing the low voltage VBB with the reference voltage VBB_REF.

Thereafter, the periodic signal generator 22 generates the periodic signal tOSC in response to the detection signal BBE, and the charge pumping unit 24 performs the negative charge pumping operation to the power supply voltage VSS to generate the low voltage VBB.

Thereafter, when the low voltage VBB is lower than the power supply voltage VSS and is a predetermined stable voltage level 'b', the initial level detector 500 inactivates the initial detection signal BB_INIT and, thus, the initial driver 40' is turned off.

Therefore, the internal voltage generator can stably generate an internal voltage, i.e., prevent the internal voltage from being abnormally varied. Accordingly, the semiconductor memory device including the internal voltage generator can be stably operated.

The present application contains subject matter related to Korean patent application No. 2004-113611, filed in the Korean Patent Office on Dec. 28, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator for use in a semiconductor memory device, comprising:
   an internal voltage generation unit for generating an internal voltage by performing a charge pumping operation to a power supply voltage based on a result of comparing a voltage level of the internal voltage with a voltage level of a reference voltage; and
   an initial internal voltage generation unit for supplying the power supply voltage as the internal voltage based on a result of comparing the voltage level of the internal voltage with a voltage level of the power supply voltage when an operating voltage supplied to the semiconductor memory device is lower than a predetermined voltage level.

2. The internal voltage generator as recited in claim 1, wherein a target voltage level of the internal voltage is lower than a voltage level of the power supply voltage.

3. The internal voltage generator as recited in claim 2, wherein the power supply voltage has a ground voltage level.

4. The internal voltage generator as recited in claim 1, wherein the initial internal voltage generation unit includes:
   an initial level detection unit for generating an initial detection signal based on the result of comparing the internal voltage with the power supply voltage; and
   an initial driver for supplying the power supply voltage as the internal voltage according to the initial detection signal.

5. The internal voltage generator as recited in claim 4, wherein the initial level detector includes:
   a first signal receiving unit for receiving the power supply voltage to generate a first input signal;
   a second signal receiving unit for receiving the low voltage to generate a second input signal; and
   a differential amplifying unit for receiving the first input signal and the second input signal to thereby generate the initial detection signal.

6. The internal voltage generator as recited in claim 5, wherein the first signal receiving unit includes:
   a p-type metal oxide semiconductor (PMOS) transistor, a gate of which receiving the power supply voltage and a source of which being coupled to the operating voltage; and
   a resistor, one terminal of which being coupled to a drain of the PMOS transistor and the other terminal of which being coupled to the power supply voltage,
   wherein the first input signal is outputted from a node commonly coupled to the drain of the PMOS transistor and the one terminal of the resistor.

7. The internal voltage generator as recited in claim 5, wherein the second signal receiving unit includes:
   a p-type metal oxide semiconductor (PMOS) transistor, a gate of which receiving the internal voltage and a source of which being coupled to the operating voltage; and
   a resistor, one terminal of which being coupled to a drain of the PMOS transistor and the other terminal of which being coupled to the power supply voltage,
   wherein the second input signal is outputted from a node commonly coupled to the drain of the PMOS transistor and the one terminal of the resistor.

8. The internal voltage generator as recited in claim 1, wherein the internal voltage generation unit includes:
   a level detector for comparing the internal voltage with the reference voltage to thereby generate a detection signal;
   a periodic signal generator for generating a periodic signal in response to the detection signal; and
   a charge pumping unit for performing the charge pumping operation to the power supply voltage in response to the periodic signal to thereby generate the internal voltage.

9. The internal voltage generator as recited in claim 4, wherein the initial driver includes an n-type metal oxide semiconductor (NMOS) transistor having a drain, a source, and a gate, the gate receiving the initial detection signal, the source being coupled to the power supply voltage, and the drain being coupled to the internal voltage.

10. An internal voltage generator for use in a semiconductor memory device, comprising:
    an internal voltage generation unit for generating an internal voltage by performing a charge pumping operation to a power supply voltage based on a result of comparing a voltage level of the internal voltage with a voltage level of a reference voltage; and
    an initial internal voltage generation unit for initializing the voltage level of the internal voltage until an operating voltage supplied to the semiconductor memory device reaches a predetermined voltage level,
    wherein the initial internal voltage generation unit outputs the power supply voltage as the internal voltage in case that the voltage level of the internal voltage is higher than that of the power supply voltage.

11. The internal voltage generator as recited in claim 10, wherein the power supply voltage has a ground voltage level.

12. An internal voltage generator for use in a semiconductor memory device, comprising:
- an internal voltage generation unit for generating an internal voltage by performing a charge pumping operation to a power supply voltage based on a result of comparing a voltage level of the internal voltage with a voltage level of a reference voltage; and
- an initial internal voltage generation unit for supplying the power supply voltage as the internal voltage based on a result of comparing the voltage level of the internal voltage with a voltage level of the power supply voltage when an operating voltage supplied to the semiconductor memory device is lower than a predetermined voltage level, wherein the internal voltage generation unit includes a level detector for comparing the voltage level of the internal voltage with the voltage level of the reference voltage; and the initial internal voltage generation unit includes an initial level detection unit for comparing the voltage level of the internal voltage with the voltage level of the power supply voltage.

* * * * *